(12) United States Patent
Jeon et al.

(10) Patent No.: US 9,233,851 B2
(45) Date of Patent: Jan. 12, 2016

(54) METHOD FOR MANUFACTURING HIGH QUALITY GRAPHENE BY HEATING CARBON-BASED SELF-ASSEMBLY MONOLAYERS

(71) Applicant: KOREA ADVANCED INSTITUTE OF SCIENCE AND TECHNOLOGY, Daejeon (KR)

(72) Inventors: SeokWoo Jeon, Daejeon (KR); JinWook Baek, Daejeon (KR); JinSup Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 27 days.

(21) Appl. No.: 14/141,544

(22) Filed: Dec. 27, 2013

(65) Prior Publication Data

US 2015/0014600 A1    Jan. 15, 2015

(30) Foreign Application Priority Data

Jul. 10, 2013   (KR) ........................ 10-2013-0080847

(51) Int. Cl.

| | |
|---|---|
| *C01B 31/04* | (2006.01) |
| *C23C 14/14* | (2006.01) |
| *C23C 16/06* | (2006.01) |
| *H01B 1/04* | (2006.01) |
| *C23F 1/14* | (2006.01) |
| *C23C 14/20* | (2006.01) |
| *C23F 1/16* | (2006.01) |

(52) U.S. Cl.
CPC ........... *C01B 31/0446* (2013.01); *C23C 14/205* (2013.01); *H01B 1/04* (2013.01); *C23F 1/16* (2013.01)

(58) Field of Classification Search
CPC ................ C01B 31/0446; C01B 31/04; C01B 31/0407; C01B 31/0415; C01B 2204/00; C01B 2204/02; C01B 2204/04; C01B 2204/06; C01B 2204/065; C01B 2204/20; C01B 2204/22; C01B 2204/24; C01B 2204/28; C01B 2204/30; C01B 2204/32; C23C 14/205; H01B 1/04
USPC ........... 423/448; 252/502; 216/13; 204/192.1
See application file for complete search history.

(56) References Cited

U.S. PATENT DOCUMENTS

2009/0068471 A1* 3/2009 Choi et al. ................... 428/408
2011/0314840 A1* 12/2011 Jahangiri-Famenini .......... 62/56

(Continued)

FOREIGN PATENT DOCUMENTS

KR   10-2011-0014446 A   2/2011
KR   10-2012-0012271 A   2/2012

(Continued)

*Primary Examiner* — Daniel C. McCracken
(74) *Attorney, Agent, or Firm* — Rabin & Berdo, P.C.

(57) ABSTRACT

The present invention relates to the method for manufacturing high quality graphene by heating carbon-based self-assembly monolayers, comprising the steps of: forming carbon source layers which are convertible into the graphene layer on the substrate; forming a metal catalyst layer on the carbon source layer; converting the carbon source layers into the graphene layer by heating the first part of the substrate using a local heating source, wherein the carbon source layers and the metal catalyst layers are formed; converting the carbon source layers into graphene by moving the local heating source and then heating the second part which is different from the first part; and removing the metal catalyst layer. The present invention also provides a substrate comprising a graphene layer manufactured by the above method and provides applications in semiconductor devices and electronic materials using the substrate.

11 Claims, 5 Drawing Sheets

(56) References Cited

U.S. PATENT DOCUMENTS

2012/0164348 A1* 6/2012 Zimmermann et al. ...... 427/555
2013/0099194 A1* 4/2013 Maliakal ........................ 257/9

FOREIGN PATENT DOCUMENTS

| KR | 10-1174670 B1 | 8/2012 |
| KR | 10-2012-0106572 A | 9/2012 |

* cited by examiner

METHOD FOR MANUFACTURING HIGH QUALITY GRAPHENE BY HEATING CARBON-BASED SELF-ASSEMBLY MONOLAYERS

BACKGROUND OF THE INVENTION

1. Field of the Invention

The present invention relates to a method for manufacturing high quality graphene by heating carbon-based self-assembly monolayers, and more particularly, relates to a method for manufacturing high quality large-area single-layered graphene by locally heating carbon source layers which can be convertible into graphene successively on a large area substrate.

2. Description of the Related Art

Graphene is a conductive material which is formed into a 2-dimensional honeycomb-shaped array of carbon atoms with a thickness of one atomic layer. When the combination structure of carbon atoms is piled up in 3-dimension, it becomes a graphite. When it is rolled up in one dimension, it transforms to a carbon nanotube. When it is formed into a ball shape, it becomes a fullerene. The 2-dimensional plane-structured graphene is interested to many researchers due to the 2-dimensional nano-scale phenomena and various applications.

In addition, the graphene is chemically and structurally very stable and it is a highly outstanding conductor transferring electrons 100 times faster than that of silicon and flowing electrical current 100 times more than that of copper. Its thermal conductivity is more than 2 times than that of diamond, its high mechanical strength is more than 200 times than that of steel, and it has transparency. Furthermore, it does not lose electrical conductivity even when stretching or folding because it has elasticity due to empty spaces in hexagonal honeycomb-shaped structures connected like a net. Recently, these unusual structures and physical properties of the graphene have been studied actively for replacement of ITO which is a primary material of transparent electrode and silicon which is a main material of semiconductor.

There are a number of manufacturing methods of the graphene such as pulling off it using a Scotch tape, an epitaxial growth method, separating the layers by oxidation of graphite and a chemical vapor deposition method. Above the rest, the best and well-known method is pulling off the graphene layer from graphite using the Scotch tape. This manufacturing method is simple and able to preserve unique characteristics of graphene, however, it also has disadvantages of difficulty in application to display or electronic device because it has a difficulty in large-area synthesis and it may not be clearly separated into graphene layer.

Meanwhile, the chemical vapor deposition can be used for manufacturing graphene by large area scale. Since the method heats an entire catalyst layer, carbon nuclei are created randomly on the surface of the catalyst layer and graphene can be grown around the center of the carbon nucleus. When a graphene grain grown around the center of the carbon nucleus butts another graphene grain, a grain boundary is formed. If each graphene grain does not match each other, defects are formed in grain boundary, and degrade electrical transport properties of the graphene. Defects within the graphene are known to accelerate reaction to surrounding environment. Moreover, a specific resistance of the grain boundary become greater from two times to ten times than that of a crystal graphene due to the grain boundary acting as a defect and thus, the chemical vapor deposition method may have a disadvantage in fabrication.

Korean registered patent No. 10-1174670 discloses a patterned fabrication method of graphene and Korean published patent No. 10-2012-0012271 discloses a manufacturing method of graphene which forms graphene by providing reaction gases including carbon sources and heating for the reaction of the gases. A transfer method for graphene on a substrate, contamination can occur from the solution for etching metal catalyst.

Therefore, a method for manufacturing the large area graphene without transferring process is required in order to maximize the advantages of the graphene by growing a large size of the graphene grain.

SUMMARY OF THE INVENTION

In order to solve the above technical problems, the present invention provides a method to form a graphene layer on a substrate, comprising the steps of: forming carbon source layers which are convertible into the graphene layer on the substrate; forming a metal catalyst layer on the carbon source layer; converting the carbon source layers into the graphene layer by heating the first part of the substrate using a local heating source, wherein the carbon source layers and the metal catalyst layers are formed; converting the carbon source layers into graphene by moving the local heating source and then heating the second part which is different from the first part; and removing the metal catalyst layer.

In a preferred embodiment of the present invention, the carbon source layer which is convertible into the graphene is formed by an arrangement of self-assembled monolayer containing carbon precursors.

In a preferred embodiment of the present invention, the carbon sources layer which is convertible into the graphene is formed by at least one compound selected from the group consisting of an alkylene which has 3 to 50 carbons and an arylene which has 6 to 50 carbons.

In a preferred embodiment of the present invention, the carbon sources layer which is convertible into graphene is formed by dipping the substrate in the liquid solution which includes at least one compound selected from the group consisting of an alkylene which has 3 to 50 carbons and an arylene which has 6 to 50 carbons.

In a preferred embodiment of the present invention, the substrate is a silicon substrate or a silicon dioxide substrate wherein a silicon dioxide layer is formed on the silicon substrate.

In a preferred embodiment of the present invention, the metal catalyst layer is formed by at least one of a metal or a metal alloy selected from the group consisting of nickel, cobalt, iron, platinum, gold, aluminum, chromium, palladium, copper, magnesium, manganese, molybdenum, rhodium, thallium, titanium, tungsten, uranium, vanadium and zirconium.

In a preferred embodiment of the present invention, the metal catalyst layer is formed by one method selected from sputtering deposition, atomic layer deposition, chemical vapor deposition and evaporation deposition.

In a preferred embodiment of the present invention, the step of converting the carbon source layer on the substrate into graphene includes the step of moving the local heating source in constant speed, and the step of moving the local heating source in constant speed includes the step of relatively and horizontally moving the local heating source against the substrate.

In a preferred embodiment of the present invention, the local heating source is a metal heating wire, a lamp apparatus which irradiates linear beam, or a laser apparatus which irradiates linear laser.

In a preferred embodiment of the present invention, the local heating source heats the substrate in the temperature range of 500 to 1700° C. and further comprising an additional heating means for heating equally the whole substrate.

In a preferred embodiment of the present invention, removing the catalyst layer is done by dipping the substrate in acid or alkali solution.

Aspects of the present invention also include a substrate comprising a graphene layer manufactured by the above method and provide applications in semiconductor devices and electronic materials using the substrate.

DETAILED DESCRIPTION OF THE PREFERRED EMBODIMENTS

Figure 1:
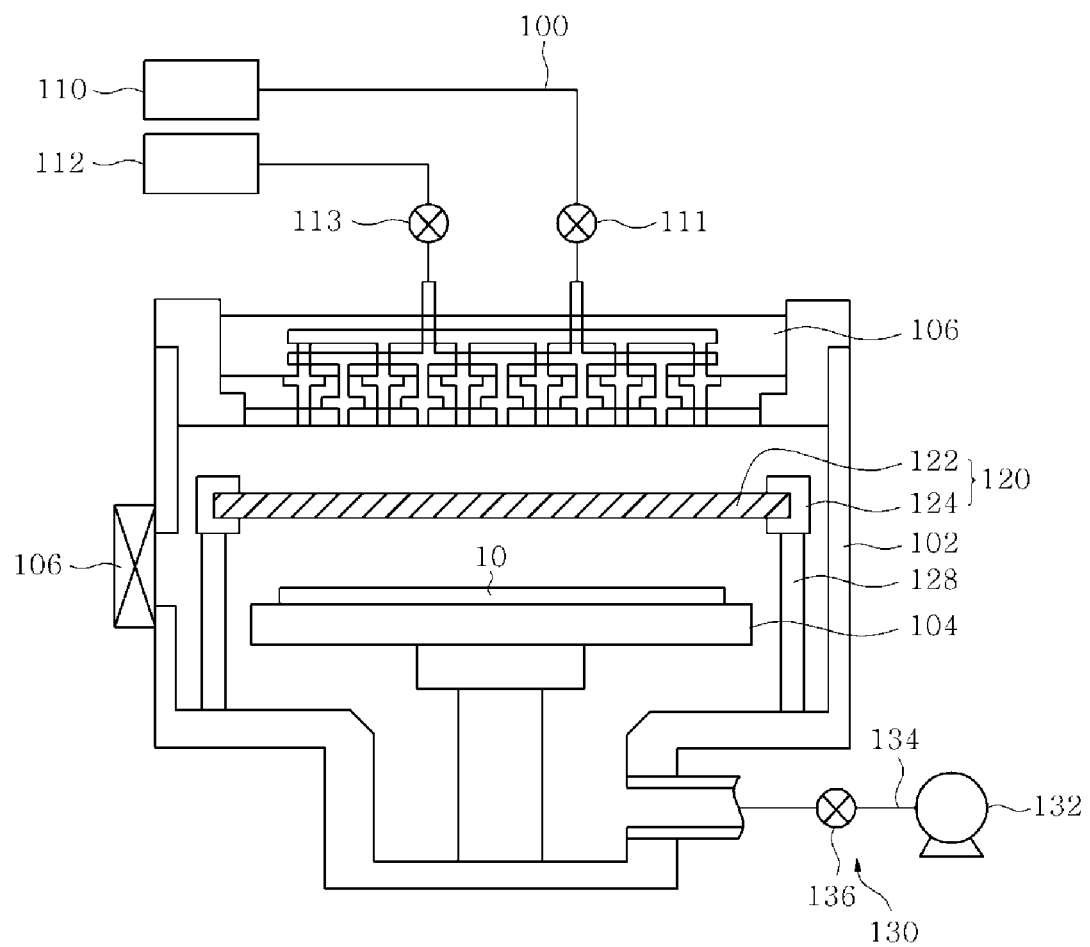
FIG. 1 is a sectional view of a graphene manufacturing apparatus including the local heating source in accordance with an embodiment of the present invention.

A fabrication method of a graphene layer on a substrate in accordance with the present invention is a self-assembly method growing a carbon source layer which is convertible into graphene by heat treatment. A self-assembly layer is a molecular layer formed through chemical bonding by spontaneous absorbing of a molecule containing surface-active functionality onto the surface of the substrate or a material, whereby it is able to form not only a self-assembled monolayer (SAM), but also molecular layers which compose the plural of layers formed on the SAM.

A dipping method, a printing method, or a spin coating method can be used for fabricating the self-assembly molecular layers. The dipping method is preferred.

The self-assembled layer according to the present invention can possess characteristics of controlling and transforming its shapes and properties as a molecule or molecular layers and it could be various types and shapes according to the surface of the self-assembled layer.

In the present invention, the carbon source layer which is convertible into the graphene by local heating is the layer composed of organic compounds which contains carbon atoms. The carbon source layer is not limited material so long as it is convertible into graphene.

The carbon source layer can be formed by at least one compound selected from the group consisting of an alkylene and an arylene. Preferably, an alkylene which has 3 to 50 carbons or arylene which has 6 to 50 carbons may be used for forming a solution. The carbon sources layer is formed by dipping a substrate into the solution. As an example, the carbon source is a silane derivative that has an alkylene chain which has 3 to 50 carbons or a silane derivative that has an arylene chain which has 6 to 50 carbons. The silane derivative has a reactor that is able to react with a solid surface of halogen, alkoxy and so on. The silane derivative can be used at least one selected from the group consisting of trichloro-octylsilane, trichloro-octadecylsilane, and trimethoxy-phenylsilane.

The carbon source can be dissolved in solvent. The solvent may be an aromatic hydrocarbon which is convertible or inconvertible into halogen, an aliphatic hydrocarbon which is convertible or inconvertible into halogen, alcohol, water, ketone, ether and so on. The aromatic hydrocarbon and aliphatic hydrocarbon is preferred. As an example, the carbon source layer can be formed by dipping the substrate in solution dissolved in solvent of aliphatic hydrocarbon such as hexene, heptene, octane, decane and so on.

The substrate has to be able to withstand more than 1400° C. It is desirable to use a material with high heat-resisting property considering a case of heating the substrate separately. As an example, the substrate can be a silicon substrate or a substrate having a layer of a silicon dioxide.

The metal catalyst layer formed on the carbon source layer of the substrate converts the carbon source layer into graphene. As an example, the metal catalyst layer can be at least one of metal or metal alloy selected from the group consisting of nickel (Ni), cobalt (Co), iron (Fe), Platinum (Pt), gold (Au), aluminum (Al), chromium (Cr), Palladium (Pd), copper (Cu), magnesium (Mg), manganese (Mn), molybdenum (Mo), rhodium (Rh), thallium (Ta), titanium (Ti), tungsten (W), uranium (U), vanadium (V) and zirconium (Zr). The thickness of the metal catalyst layer can be a range of 1 nm to 2 mm, preferably 30 nm to 30 um, more preferably 200 to 500 nm. The metal catalyst plays important role in forming high quality graphene because it functions as a catalyst but it also blocks the carbon source layer from being evaporated at high temperature. When the thickness is thinner than that of the mentioned above, the metal catalyst layer cannot be effective, as a result, it causes degrading the quality of the graphene. Thus, it is recommended to derive catalysis enough within the said range to form the graphene.

In addition, the metal catalyst layer can be formed by an atomic layer deposition, a chemical vapor deposition, a sputtering deposition, and an evaporation method and so on. The sputtering deposition for the metal catalyst layer is desirable. As an example of the formation of the metal catalyst layer using the sputtering deposition of nickel, before putting the substrate into an RF sputtering apparatus, the chamber of the RF sputtering apparatus is maintained at a pressure of $5\times10^{-6}$ torr and argon gas is injected into the chamber at a flux of 10 sccm, and then inserting the substrate into the chamber, maintaining entire pressure of the chamber at 10 mtorr by controlling a pressure regulating valve or throttle valve, applying 150 W of electric power and depositing for 700 seconds. As a result, a thickness of metal catalyst of approximately 300 nm can be formed. The substrate wherein the metal catalyst layer is formed can be locally heated using the local heating source of a graphene manufacturing apparatus.

Figure 2:
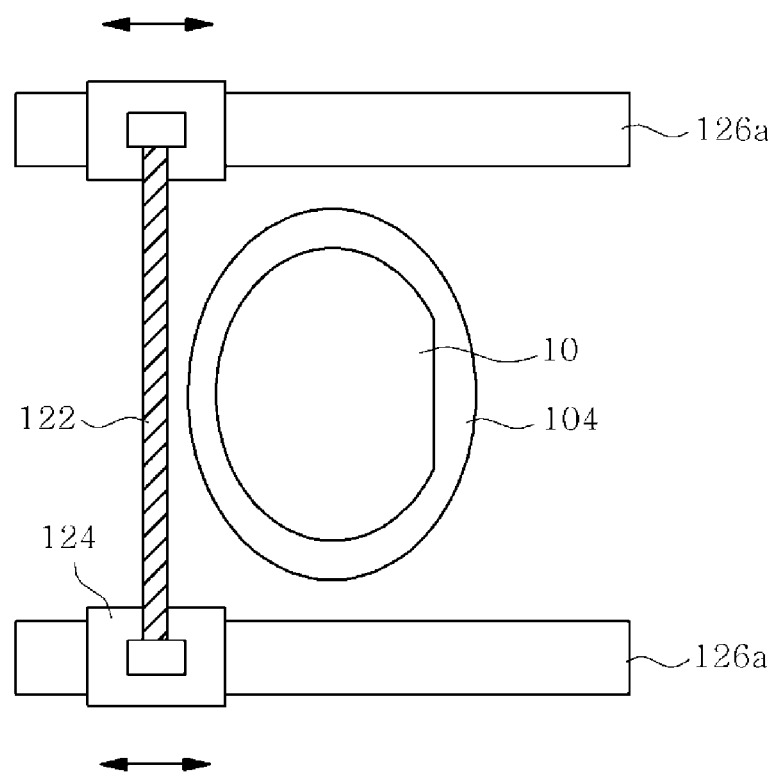
FIG. 2 is a top view showing a heat treatment unit of the graphene manufacturing apparatus.

In accordance with an embodiment of the present invention, FIG. 1 is a cross sectional view that shows a graphene manufacturing apparatus 100 including a local heating source, and FIG. 2 is a plain figure that shows a heat treatment unit of the graphene manufacturing apparatus shown in FIG. 1.

Referring to the FIG. 1, the graphene manufacturing apparatus 100 includes a chamber 102, a substrate supporting part 104, a gate valve 108, gas supply parts 110 and 112, and a heat treatment unit 120 which includes a local heating source 122.

The substrate supporting part 104 is located inside of the chamber 102 in order to support the substrate 10. The gate valve 108 is located on a side wall of the chamber 102. The substrate 10 having the metal catalyst layer is loaded through the gate valve 108, and then seated on the substrate supporting part 104.

The gas supply part consists of a carbon source supply part 110 which provides carbon source gas into the chambers 102 and a hydrogen gas supply part 112 which provides hydrogen gas, and a purge gas supply part(not shown).

A shower head 106 is located on top of the chamber 102 to provide gases equally into the chamber 102. The gas supply parts are connected to the shower head 106 using pipes. Each pipe is equipped with a gate valve to control the flux of the gas supplied into the chamber 102.

The shower head 106 can have a plurality of nozzles in order to equally supply the gases on the substrate 10. Each of carbon gas, hydrogen gas and purge gas is not allowed to be mixed with each other inside the shower head 106 and can be separately supplied on the substrate through the shower head 106. The purge gas can be used as a pressure regulating gas for adjusting the pressure inside the chamber 102.

The carbon source supply part 110 can supply various source gases as a source of a vapor carbon. The carbon source gas may comprise a hydrocarbon gas. As examples of the hydrocarbon gas, there are methane, ethane, ethylene, acetylene, propane, propylene, butane, butadiene, pentane, hexane, and so on. In this embodiment, at least one selected from the carbon gas, hydrogen gas and the purge gas can be selectively supplied in proper amount for converting layers of the carbon source into graphene.

In other words, during the process of heating the substrate in order to manufacture the graphene on the substrate using the local heating source in the present invention, the gas such as the hydrogen gas or argon gas as a purge gas can be flowed into inside of the chamber in certain ratio, and the ratio of the influx and types of the gas can affect the quality of the graphene.

The heat treatment unit 120 locally heats the metal catalyst layer on the substrate and performs successive heat treatment by moving a heating part. The heat treatment unit 120 can be installed on the top of the substrate supporting part inside the chamber 102. The heat treatment unit 120 includes a driving part 124 which moves the local heating source 122 at a constant speed for locally and successively heating the substrate.

The local heating source 122 consists of heat sources such as heating wires or light sources such as laser and lamp. It is desirable to locate the substrate as nearby as possible for the thermal efficiency. The heating wire is supported by the driving part 124. Referring to the FIG. 2, the driving part 124 can perform successive heat treatment on the substrate 10 by moving along with the first guide rail 126a and second guide rails 126b installed on the driving supporting part 128 inside the chamber 102. The heating wire 122 can horizontally and relatively move on the substrate by the driving part 124.

The successive heat treatment or successive local heat treatment is possible by relative moving of the heating wire, and the range of temperature in the successive heat treatment process depends on types of the heating wire.

The moving speed or scanning speed of the heating wire is adjustable from several tens of nanometers per minute (nm/min) to a few kilometers per minute (km/min), the speed from 10 µm/min to 40 mm/min is preferred and speed from 10 µm/min to 5 mm/min is more preferred.

The moving speed of the heating source may be an indicator which shows how fast heating and cooling of the substrate at a local point. In the present invention, successive heat treatment which is sequential heating after cooling is possible by moving the location of the heating wire 122 from a part of the substrate to another part of the substrate. In order to manufacture the graphene layer, after heating the first part of the substrate using the heating wire 122, we can move the heating wire 122 to cool the first part of the substrate at the same time, and heat the second part on the substrate which is separated from the first part for the successive heat treatment on the carbon source layer on the substrate.

The heating wire 122 can be moved horizontally against the substrate 10. It is possible to heat the substrate sequentially by moving the heating wire 122 in one direction successively while the substrate is fixed.

On the contrary, the substrate 10 can be moved relatively against the heating wire 122 while the heating wire 122 is fixed. In other words, it is able to move the substrate horizontally while the local heating wire 122 is fixed on the certain location.

The local heating wire 122 may be at least one of a metal or a metal alloy selected from the group consisting of W, Cu, Al, Ni, Ag, Cr, Ti, and brass. The diameter of the metal wire can be 0.3 to 10 mm, and 1 mm is preferred. The length of the wire can be 30 to 1000 mm, and 160 mm is preferred.

Figure 3:
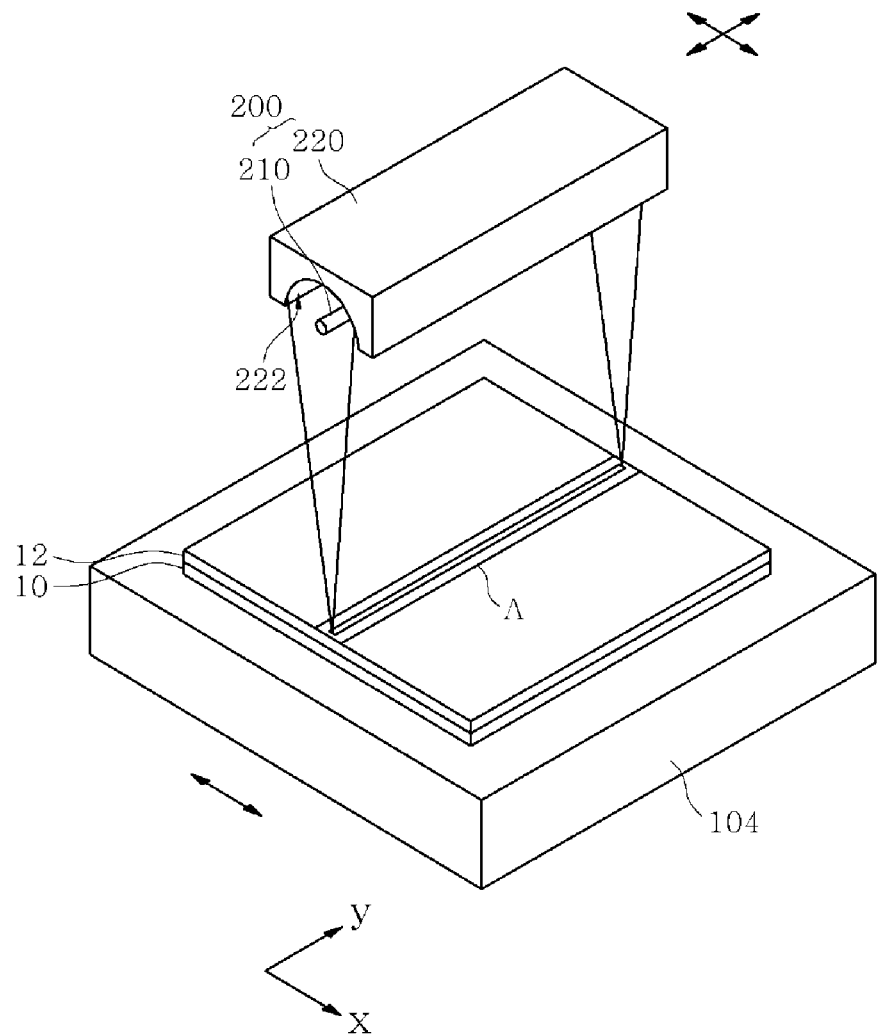
FIG. 3 is a perspective view showing a lamp unit of the graphene manufacturing apparatus.

As a further embodiment of the present invention, light source such as a lamp can be used as the local heating source. FIG. 3 shows the graphene manufacturing apparatus having a lamp unit. The lamp unit may irradiate linear beams or liner laser beams. The lamp unit 200 can perform successive heat treatment by moving the heating part and by locally heating the metal catalyst layer 12 on the substrate 10. The lamp unit 200 may be installed on the top of the substrate supporting part 104 inside the chamber 102 in order to move relatively against the substrate 10.

In the present invention, the temperature of the local heating source is important in manufacturing the graphene. The range of temperature of the local heating source may be 300 to 2000° C., preferably 500 to 1700° C. The graphene can be formed on the substrate by heating the first or second part of the substrate which includes the metal catalyst layer and the carbon source layer. The thickness of the graphene sheet may be a range of 0.2 nm to 20 nm.

The present invention may independently include additional heating means which can heat the entire substrate equally. It is desirable to locate the additional heating means on the under part or the top of the substrate. As an example, the additional heating means may be a heat plate located under the substrate, or a uniform light source which is located on the top of the substrate. The additional heating means can reduce a process time for manufacturing the graphene.

The process of converting the carbon source layer into graphene can be done in the chamber in an inert gas ambient. The inert gas ambient is embodied by the purge gas or by the inert gas which is independent on a supplying source gas through a separate injection device.

The removing process of the metal catalyst layer removes the metal catalyst layer on the graphene layer. The removing process of the metal catalyst can be done by acid or alkali treatment and additionally by a mechanical process such as polishing and chemical-mechanical polishing (CMP).

The acid or alkali treatment is dissolving and removing the metal catalyst layer by dipping the substrate wherein the metal catalyst layer is formed in acid or alkali solution. The concentration and the dipping time can be properly adjustable depending on the thickness and type of the metal catalyst layer.

The acid for the acid treatment may be organic acids such as an organic carboxylic acid, or inorganic acids such as hydrochloric acid and sulfuric acid. As the oxidizing agent, hydrogen peroxide and iron oxide can be used. In addition, as the mechanical processes, the polishing method in metal layer by the abrasive, such as CMP, is available.

The removing process of the metal catalyst layer can be done by the oxidizing agent and etching fluids in acidic solution. Hydrochloric acid, hydrogen fluoride (HF), BOE (buffered oxide etch), ferric chloride ($FeCl_3$) solution, ferric nitrate ($Fe(NO_3)_3$) solution, or ammonium persulfate ($(NH_4)_2S_2O_8$) may be used. The concentration of 0.1 to 1.0 M of ammonium persulfate is desirable for etching the metal catalyst layer.

The present invention has an advantage of directly forming the graphene on the silicon dioxide layers, comparing with conventional technology which requires transferring process on the silicon dioxide layer on the substrate.

Figure 4:
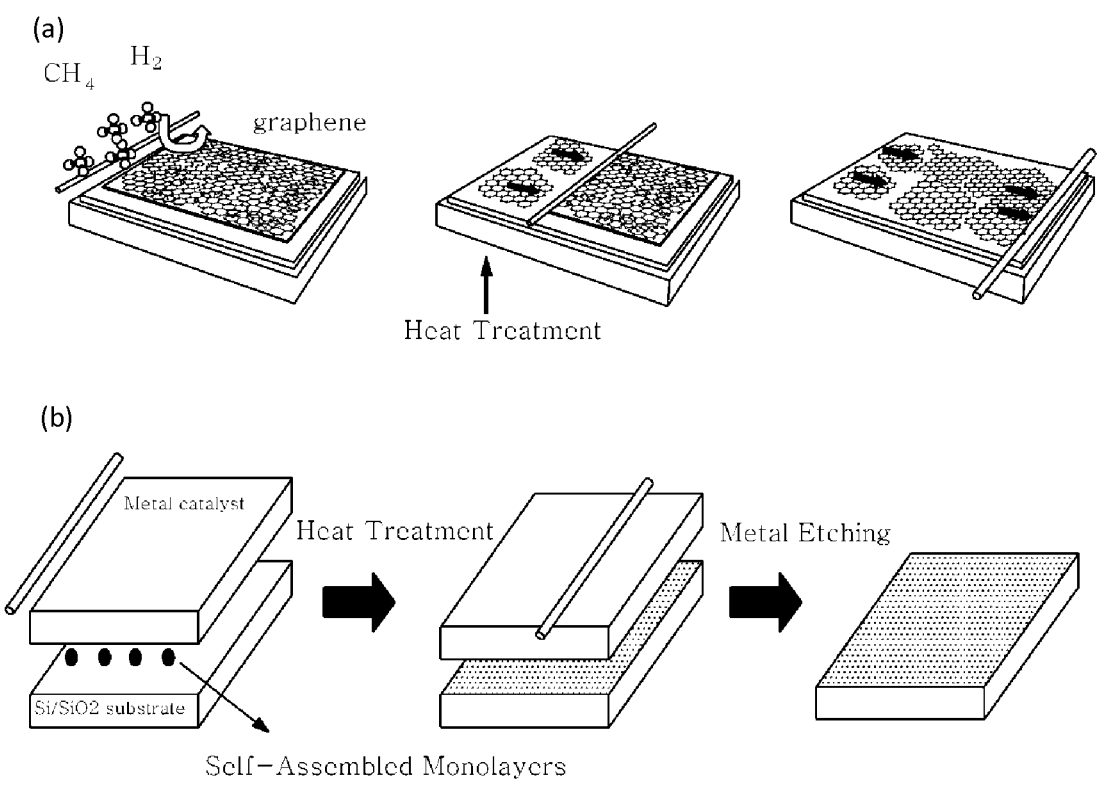
FIG. 4a shows a process of manufacturing graphene based on the conventional technique and FIG. 4b shows the process of manufacturing graphene in accordance with an embodiment of the present invention.
Figure 5:
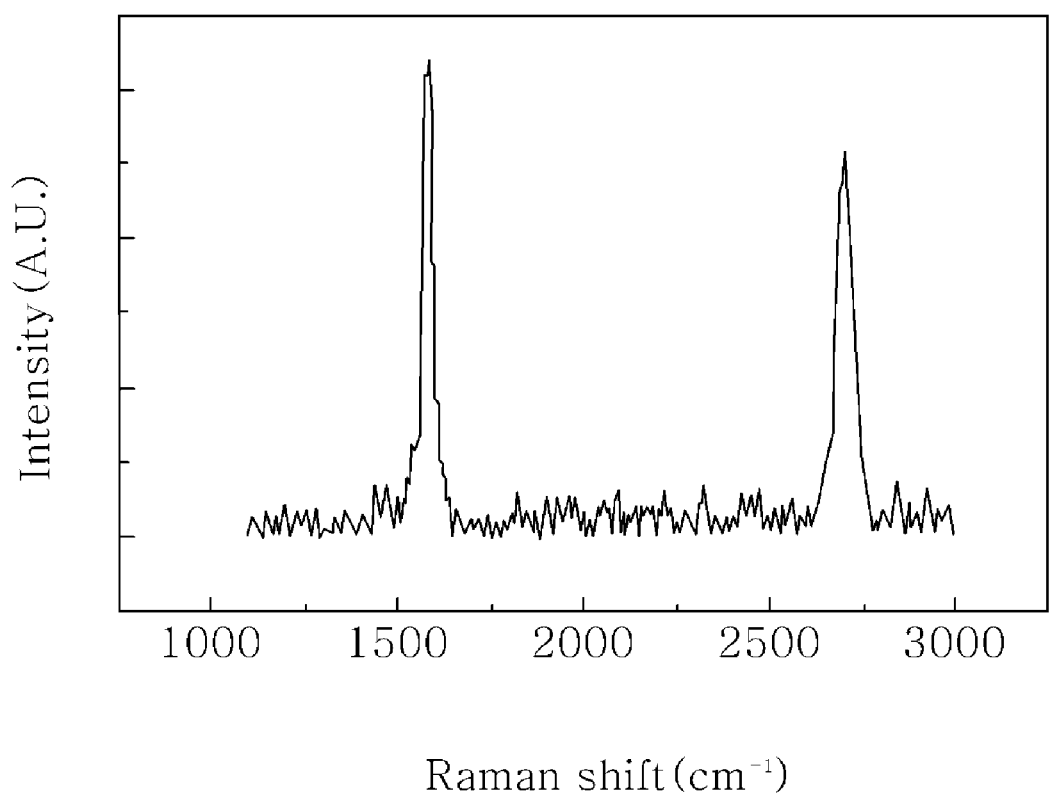
FIG. 5 shows a graph of Raman spectroscopy analysis of the graphene fabricated by an embodiment of the present invention.

FIG. 4a shows the conventional method for manufacturing the graphene using the local heating source by supplying a carbon gas source from outside of the copper substrate. It is needed to transfer the graphene formed on the copper substrate to the silicon dioxide layer on the substrate for applications.

On the other hand, FIG. 4b show the present method of manufacturing the graphene using the local heating source and by locally heating the substrate wherein the metal catalyst layer and the carbon source layer are formed.

In other words, the present invention can form the graphene layer directly on the silicon dioxide substrate by forming the carbon source layer and the metal catalyst layer in advance on the silicon dioxide substrate.

As a further embodiment of the present invention, the substrate which includes the graphene layer manufactured by the said method can be provided for applications in semiconductor devices or various electronic materials.

In present invention, the grain boundary can be reduced due to forming the large-size graphene layer directly on the large-size substrate. In addition, the grain boundary also is arranged in consistent direction because the process of heating and cooling has a consistent direction following the movement of the heating source for formation of the graphene layer. These features improve the properties of the graphene and also enable applications of the graphene in semiconductor devices or various electronic materials.

Embodiment 1

Step 1. Formation of the Carbon Source Layer which is Convertible into Graphene and Formation of the Metal Catalyst Layer A silicon substrate including a silicon dioxide layer is treated in piranha solution which is mixed solution of sulfuric acid and hydrogen peroxide for 10 minutes and is washed by deionized water.

In order to form a carbon source layer, 10 mM solution which is the mixture of trichlorooctylsilane 2.4767 g and hexane solvent 1 L is prepared as a carbon source. The prepared substrate is dipped into the prepared solution for 20 minutes, washed in deionized water, and treated by heat at 120° C.

Then, in order to form a nickel metal catalyst layer, the flux of argon gas is injected at 10 sccm into the chamber of an RF sputtering apparatus in $5\times10^{-6}$ before loading the substrate. Under the entire pressure of 10 mtorr in the chamber after loading the substrate, nickel is deposited for 700 seconds by applying the power of 150 W. As a result, approximately 300 nm of nickel-metal catalyst layer has been formed on the substrate.

Step 2. Formation of the Graphene Layer and Removal of the Catalyst Layer

After the sputtering process, the substrate is inserted in a heating treatment chamber, and heated at 800° C. When the above temperature is reached, the substrate is heated locally and constantly by moving a heating wire at 1400° C. in speed of 1.5 mm/min. During the heat treatment process, the argon gas is flowed in the chamber in 200 sccm.

Finally, the substrate wherein the graphene layer is formed is dipped in the ammonium sulfate solution of 0.1M in more than 240 minutes for removing the metal catalyst layer.

Experiment 1

1. Raman Spectroscopic Analysis

FIG. 6 shows the result of Raman spectroscopic analysis of the graphene manufactured by the embodiment of the present invention to evaluate characteristics of the graphene. The peak position and shape which represented by D, G and 2D peak varies depending on the number of layers and the degree of defects. The ratio of the intensity of D and G peak is used as a measure indicating defects in the graphene. The lower ratio indicates the higher quality of graphene.

As shown in FIG. 6, the result from Raman spectroscopic analysis of the manufactured graphene shows that the G peak around Raman shift 1600 $cm^{-1}$ and the 2D peak around Raman shift 2700 $cm^{-1}$. However, the D peak which means defects in the graphene is almost not observed. This means that the quality of the manufactured graphene is high.

What is claimed is:

1. A method for forming a graphene layer on a substrate, comprising:

forming a carbon source layer which is convertible into a graphene layer on the substrate;

forming a metal catalyst layer on the carbon source layer;

heating, by a first heating source, the substrate on which the carbon source layer and the metal catalyst layer are formed up to a first temperature range, so that the substrate, the carbon source layer and the metal catalyst layer are uniformly heated and a processing time for forming the graphene layer is reduced, the first heating source being disposed under or over the substrate;

heating, by a second heating source, a first part of the substrate on which the carbon source layer and the metal catalyst layer are formed, at a second temperature range to convert the carbon source layer in the first part into the graphene layer;

moving the second heating source to a second part of the substrate on which the carbon source layer and the metal catalyst layer are formed, and heating the second part to convert the carbon source layer in the second part into the graphene layer, removing the metal catalyst layer, wherein the second temperature range is higher than the first temperature range, and the second heating source heats the substrate and the layers after a temperature in a heating treatment chamber reaches the first temperature range, and wherein the carbon source layer is formed by a self-assembly method and by at least one compound selected from the group consisting of an alkylene which has 3 to 50 carbons and an arylene which has 6 to 50 carbons.

2. The method according to claim 1, wherein the carbon sources layer is formed by dipping the substrate in a liquid solution which includes at least one compound selected from the group consisting of an alkylene which has 3 to 50 carbons and an arylene which has 6 to 50 carbons.

3. The method according to claim 1, wherein the substrate is a silicon substrate, or a silicon dioxide substrate which is formed on the silicon substrate.

4. The method according to claim 1, wherein the metal catalyst layer is formed by at least one of a metal or a metal alloy selected from the group consisting of nickel, cobalt, iron, platinum, gold, aluminum, chromium, palladium, copper, magnesium, manganese, molybdenum, rhodium, thallium, titanium, tungsten, uranium, vanadium and zirconium.

5. The method according to claim 1, wherein the metal catalyst layer is formed by one method selected from sputtering deposition, atomic layer deposition, chemical vapor deposition and evaporation deposition.

6. The method according to claim 1, wherein the second heating source heats the first and second parts while moving over the first and second parts, respectively, in a constant speed.

7. The method according to claim 6, wherein the second heating source moves relatively and horizontally against the substrate.

8. The method according to claim 1, wherein the second heating source is a metal heating wire.

9. The method according to claim 1, wherein the second heating source is a lamp apparatus which irradiates linear beam or a laser apparatus which irradiates linear laser.

10. The method according to claim 1, wherein the first temperature range is about 800° C., and the second temperature range is between 800 to 1700° C.

11. The method according to claim 1, wherein said removing the metal catalyst layer is done by dipping the substrate in acid or alkali solution.

* * * * *